US008098007B2

(12) United States Patent
Kim et al.

(10) Patent No.: US 8,098,007 B2
(45) Date of Patent: Jan. 17, 2012

(54) ORGANIC LIGHT EMITTING DISPLAY DEVICE (75) Inventors: Tae-Jin Kim, Suwon-si (KR); Bon-Seog Gu, Suwon-si (KR); Keum-Nam Kim, Suwon-si (KR); Hae-Kwan Seo, Suwon-si (KR)

(73) Assignee: Samsung Mobile Display Co., Ltd., Nongseo-Dong, Giheung-Gu, Yongin, Gyunggi-Do (KR)

( * ) Notice: Subject to any disclaimer, the term of this patent is extended or adjusted under 35 U.S.C. 154(b) by 307 days.

(21) Appl. No.: 12/219,619

(22) Filed: Jul. 24, 2008

(65) Prior Publication Data
US 2009/0184627 A1 Jul. 23, 2009

(30) Foreign Application Priority Data
Jan. 18, 2008 (KR) .................. 10-2008-0005619

(51) Int. Cl.
*H01L 51/50* (2006.01)
(52) U.S. Cl. .................. 313/504; 313/512; 428/690
(58) Field of Classification Search .......... 313/504–506, 313/512; 428/690
See application file for complete search history.

(56) References Cited

U.S. PATENT DOCUMENTS

| | | | |
|---|---|---|---|
| 6,407,795 B1 | 6/2002 | Kamizono et al. | |
| 2002/0017859 A1* | 2/2002 | Ishikawa et al. | 313/504 |
| 2006/0022589 A1 | 2/2006 | Cok | |
| 2007/0134830 A1 | 6/2007 | Park et al. | |
| 2007/0216299 A1 | 9/2007 | Park et al. | |
| 2008/0012474 A1* | 1/2008 | Sung et al. | 313/504 |
| 2009/0184626 A1* | 7/2009 | Kim et al. | 313/504 |

FOREIGN PATENT DOCUMENTS

| | | |
|---|---|---|
| JP | 11-354272 A | 12/1999 |
| JP | 2001-236025 A | 8/2001 |
| JP | 2003086362 | 3/2003 |
| JP | 2005-173579 A | 6/2005 |

(Continued)

OTHER PUBLICATIONS

Chinese Office Action issued by Chinese Patent Office on May 11, 2010 corresponding Chinese Patent Application No. 200910001278. X, Priority Application No. 10-2008-0005619 and its English translation attached.

(Continued)

*Primary Examiner* — Nimeshkumar Patel
*Assistant Examiner* — Mary Ellen Bowman
(74) *Attorney, Agent, or Firm* — Robert E. Bushnell, Esq.

(57) ABSTRACT

An organic light emitting display device capable of minimizing an IR drop of pixel power sources supplied to an organic light emitting display panel is taught. The organic light emitting display device includes an organic light emitting display panel comprising a first side on which an image is displayed and a second side that faces the first side and a plurality of first and second power source pads provided at two or more edges of the second side to receive first and second pixel power sources in at least two different directions; and a pixel power source supplying flexible printed circuit board (FPCB) provided on the second side of the organic light emitting display panel to comprise a plurality of pads electrically coupled to the first and second power source pads and to supply the first and second pixel power sources to the organic light emitting display panel.

16 Claims, 4 Drawing Sheets

FOREIGN PATENT DOCUMENTS

| | | |
|---|---|---|
| JP | 2007-164184 A | 6/2007 |
| KR | 10-2000-0050298 | 8/2000 |
| KR | 10-2004-0004148 | 1/2004 |
| KR | 10-2005-0003512 | 1/2005 |
| KR | 1020050065947 A | 6/2005 |
| KR | 1020050067832 A | 7/2005 |
| KR | 1020050110463 A | 11/2005 |

OTHER PUBLICATIONS

European Office Action issued on Dec. 3, 2010 in the corresponding European Patent Application No. 09250125.3.

European Search Report issued by the EPO, dated Mar. 31, 2011, corresponding to European Patent Application No. 09250125.3.

* cited by examiner

ORGANIC LIGHT EMITTING DISPLAY DEVICE

CLAIM OF PRIORITY

This application makes reference to, incorporates the same herein, and claims all benefits accruing under 35 U.S.C. §119 from an application for ORGANIC LIGHT EMITTING DISPLAY earlier filed in the Korean Intellectual Property Office on 18 Jan. 2008 and there duly assigned Serial No. 10-2008-0005619.

BACKGROUND OF THE INVENTION

1. Field of the Invention

The present invention relates to a process and an organic light emitting display device, and more particularly, to a process for fabricating an organic light emitting display device capable of minimizing an IR drop of pixel power sources supplied to an organic light emitting display panel and an organic light emitting display device capable of minimizing an IR drop of pixel power sources supplied to an organic light emitting display panel.

2. Description of the Related Art

Among FPDs (flat-panel displays), organic light emitting display devices display images using organic light emitting diodes (OLED) that generate lights by the re-combination of electrons and holes. Since the organic light emitting display device has higher response speed and is driven with lower power consumption, the organic light emitting display device is spotlighted as a next generation display.

In general, the organic light emitting display device includes a pixel unit including a plurality of pixels, driving circuits for supplying driving signals to the pixel unit, and a power source supplying circuit for supplying pixel power sources to the pixel unit.

The pixels emit lights with brightness corresponding to data signals supplied in synchronization with scan signals when the scan signals are supplied. Therefore, the organic light emitting display panel displays a predetermined image.

In the organic light emitting display device, the brightness of the emitted lights of the pixels is affected by the voltage of the pixel power sources. That is, the pixel power sources determine the brightness of the emitted lights of the pixels together with the data signals.

Therefore, in order to display an image with a uniform picture quality, the pixel power sources having an identical voltage level are supplied to the pixels respectively.

The pixel power sources however are direct current (DC) power sources having a predetermined voltage level and IR drop may be generated while passing through a power source line. The IR drop is a voltage drop associated with an electrical resistance (R) of a power source or an electrical current flow (I), and is the product of the electrical current (in amperes) and the electrical resistance (in ohms).

In particular, since the length of the power source line increases while the size of the display panel of the organic light emitting display device increases, brightness deviation between the pixels may be increased in accordance with the distance between the pixels and a power source pad that receives the pixel power sources.

Therefore, a method of minimizing the IR drop of the pixel power sources is required.

SUMMARY OF THE INVENTION

It is therefore one object of the present invention to provide a process and an improved organic light emitting display device to overcome the disadvantages as stated above.

It is another object of the present invention to provide an organic light emitting display device capable of minimizing the IR drop of pixel power sources supplied to an organic light emitting display panel.

In order to achieve the foregoing and/or other objects of the present invention, an organic light emitting display device may be constructed with an organic light emitting display panel having a first side on which an image is displayed and a second side that faces the first side and a plurality of first and second power source pads provided at two or more edges of the second side to receive first and second pixel power sources in at least two directions and a pixel power source supplying flexible printed circuit board (FPCB) provided on the second side of the organic light emitting display panel to provide a plurality of pads electrically coupled to the first and second power source pads and to supply the first and second pixel power sources to the organic light emitting display panel.

Here, the first power source pads may be formed at a first edge region of the second side and a second edge region that faces the first edge region and the second power source pads may be formed at a third edge region of the second side and a fourth edge region that faces the third edge region. In addition, the first power source pads may be formed in the first and second edge regions and the second power source pads may be formed in the third and fourth edge regions. The first power source pads and the second power source pads maybe formed at different edges of the second side of the organic light emitting display panel. In addition, the first and second power source pads may receive the first and second pixel power sources in two directions that face each other of the pixel power source supplying FPCB.

In addition, a pixel unit that receives the first and second pixel power sources from the first and second power source pads may be positioned at the center of the organic light emitting display panel and a plurality of signal pads for supplying driving signals to the pixel unit may be formed between the first and second power source pads. Here, the signal pads may be electrically coupled to driving FPCBs provided in addition to the pixel power source supplying FPCB to transmit the driving signals supplied from the driving FPCBs to the pixel unit. In addition, the driving FPCBs may be plural. In addition, at least one of a scan driver and a data driver may be mounted on the driving FPCBs so that at least one of the scan signals and the data signals may be supplied to the pixel unit. In addition, the pixel power source supplying FPCB may be provided to overlap the pixel unit and the pads of the pixel power source supplying FPCB maybe formed to overlap the first and second power source pads.

In addition, at least one aperture may be formed in at least one region of the pixel power source supplying FPCB.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicated the same or similar components, wherein.

DETAILED DESCRIPTION OF THE INVENTION

Hereinafter, certain exemplary embodiments according to the present invention will be described with reference to the accompanying drawings. Here, when a first element is described as being coupled to a second element, the first element may be not only directly coupled to the second element but may also be indirectly coupled to the second element via a third element. Further, some of the elements that are not essential to the complete understanding of the invention are omitted for clarity. Also, like reference numerals refer to like elements throughout.

Hereinafter, exemplary embodiments of the present invention will be described in detail with reference to the accompanying drawings.

Figure 1:
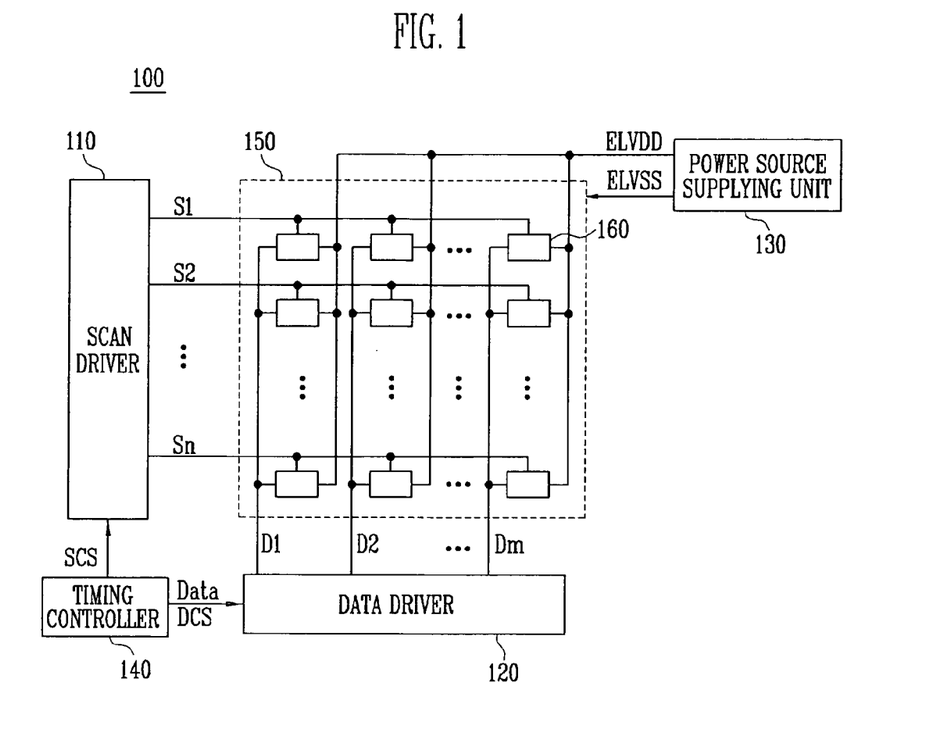
FIG. 1 is a block diagram illustrating an example of an organic light emitting display device constructed as an embodiment of the principle of the present invention.

FIG. 1 is a block diagram illustrating an example of an organic light emitting display device constructed as the present invention.

Referring to FIG. 1, an organic light emitting display device 100 includes a scan driver 110, a data driver 120, a timing controller 140, a pixel unit 150, and a power source supplying unit 130.

Scan driver 110 generates scan signals to correspond to scan driving control signals SCS supplied from timing controller 140. The scan signals generated by scan driver 110 are sequentially supplied to scan lines S1 to Sn.

Data driver 120 generates data signals to correspond to data Datagg and data driving control signals DCS supplied from timing controller 140. The data signals generated by data driver 120 are supplied to data lines D1 to Dm in synchronization with the scan signals.

Timing controller 140 generates the scan driving control signals SCS and the data driving control signals DCS in response to synchronizing signals supplied from the exterior. The scan driving control signals SCS generated by timing controller 140 are supplied to scan driver 110 and the data driving control signals DCS are supplied to data driver 120. In addition, timing controller 140 transmits the data Data supplied from the exterior to data driver 120.

Pixel unit 150 includes a plurality of pixels 160 formed in regions partitioned off by the scan lines S1 to Sn and the data lines D1 to Dm. Pixel unit 150 displays an image to correspond to the scan signals supplied from scan driver 110 and the data signals supplied from data driver 120.

Power source supplying unit 130 generates first and second pixel power sources ELVDD and ELVSS using an external power source supplied from an external power source supplying apparatus (not shown). Then, power source supplying unit 130 supplies the generated first and second pixel power sources ELVDD and ELVSS to pixel unit 150.

In organic light emitting display device 100, pixel unit 150 is formed in the organic light emitting display panel. Scan driver 110 and/or data driver 120 are/is mounted on the organic light emitting display panel or an additional flexible printed circuit board (FPCB). Scan driver 110 and/or data driver 120 may be electrically coupled to the organic light emitting display panel through a pad unit.

In addition, power source supplying unit 130 and/or timing controller 140 are/is mounted on a driving board outside the organic light emitting display panel to be electrically coupled to the organic light emitting display panel and/or the driving FPCBs through the FPCB.

Figure 2:
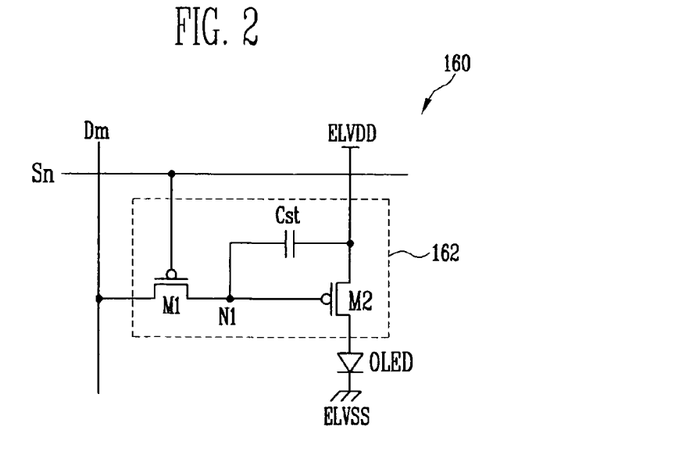
FIG. 2 is a circuit diagram illustrating an example of one pixel illustrated by FIG. 1.

FIG. 2 is a circuit diagram illustrating an example of the pixel of FIG. 1. For convenience sake, in FIG. 2, a pixel coupled to an nth scan line Sn and an mth data line Dm will be illustrated.

Referring to FIG. 2, a pixel 160 includes an organic light emitting diode OLED, the scan line Sn, the data line Dm, a first pixel power source ELVDD, and a pixel circuit 162 coupled to the OLED.

The anode electrode of the OLED is electrically coupled to pixel circuit 162 and the cathode electrode is electrically coupled to the second pixel power source ELVSS. The OLED emits lights with the brightness of the lights corresponding to the amount of electrical current supplied from pixel circuit 162.

Pixel circuit 162 includes a first transistor M1, a second transistor M2, and a storage capacitor Cst.

The first electrode of the first transistor M1 is electrically coupled to the data line Dm, and the second electrode of the first transistor M1 is electrically coupled to a first node N1. The gate electrode of the first transistor M1 is electrically coupled to the scan line Sn. The first transistor M1 is turned on when a scan signal is supplied to the scan line Sn to transmit a data signal supplied to the data line Dm to the first node N1.

The first electrode of the second transistor M2 is electrically coupled to the first pixel power source ELVDD, and the second electrode of the second transistor M2 is electrically coupled to the anode electrode of the OLED. The gate electrode of the second transistor M2 is coupled to the first node N1. The second transistor M2 controls electrical current that flows from the first pixel power source ELVDD to the anode electrode of the OLED to correspond to a voltage supplied to the gate electrode of second transistor M2.

One terminal of a storage capacitor Cst is coupled to the first node N1, and the other terminal of the storage capacitor Cst is coupled to the first pixel power source ELVDD and the first electrode of the second transistor M2. The storage capacitor Cst stores a voltage corresponding to a data signal supplied to the first node N1 when the scan signal is supplied to the scan line Sn and maintains the stored voltage in one frame.

The operation process of pixel 160 will be described in detail. First, when the scan signal is supplied to the scan line Sn, the first transistor M1 is turned on. When the first transistor M1 is turned on, the data signal supplied to the data line Dm is transmitted to the first node N1 through the first transistor M1. When the data signal is transmitted to the first node N1, a voltage corresponding to a difference between the voltage of the first pixel power source ELVDD and the data signal is charged in the storage capacitor Cst. Then, the second transistor M2 controls the electrical current that flows from the first pixel power source ELVDD to the OLED to correspond to a voltage supplied to the gate electrode thereof. Therefore, the OLED emits light with brightness corresponding to the amount of electrical current supplied thereto to enable the display of an image.

As described above, pixel 160 emits lights with brightness corresponding to the amount of current supplied from the second transistor M2. Here, the voltage of the first node N1 to which the gate electrode of the second transistor M2 is electrically coupled is maintained in one frame by the storage capacitor Cst.

The storage capacitor Cst is charged with a voltage corresponding to a difference between the voltage of the first pixel power source ELVDD and the data signal while the data signal is supplied to maintain the voltage in one frame. Therefore, the emission brightness of pixel 160 varies in accordance with the voltage of the first pixel power source ELVDD and the data signal.

Here, the voltage of the first pixel power source ELVDD supplied to the pixels 160 may vary by the IR drop generated while passing through a power source line. Therefore, pixels 160 that receive the same data signal emit light with different brightness so that picture quality may deteriorate.

Therefore, a method of minimizing the IR drop of the first pixel power source ELVDD is to be found. According to the present invention, the method will be provided through the embodiments to be mentioned later.

Figure 3:
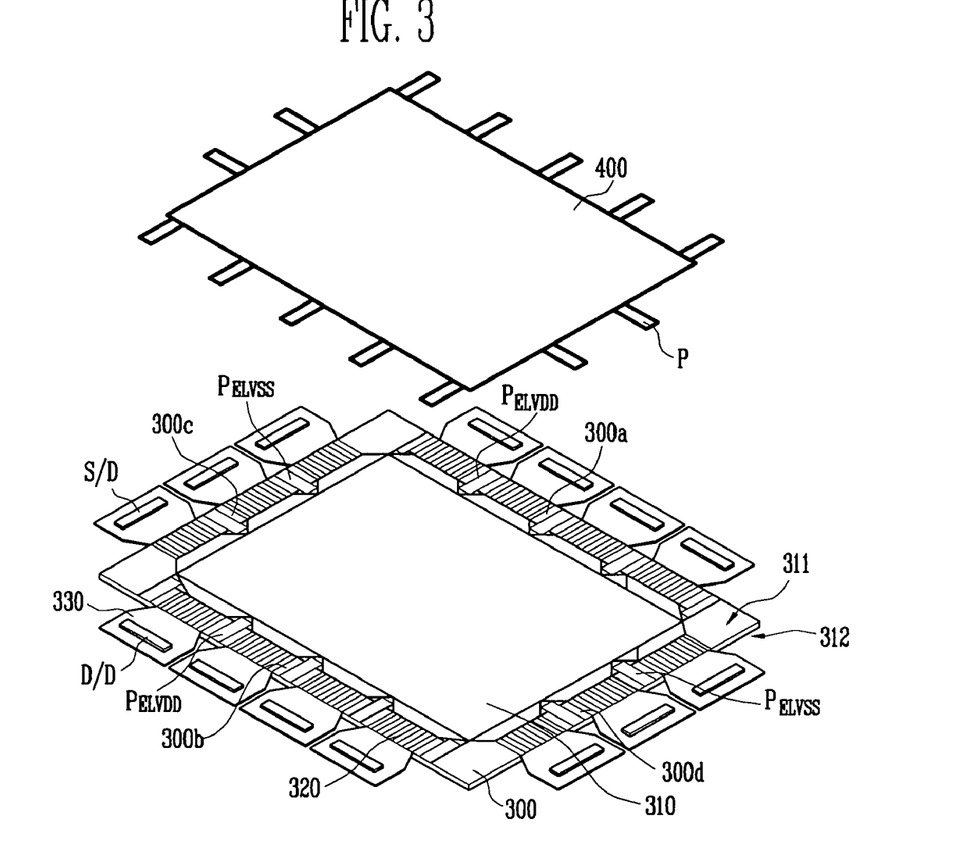
FIG. 3 is an exploded perspective view of an organic light emitting display panel and a flexible panel circuit board (FPCB) for supplying power sources to pixels constructed as an embodiment of the present invention.
Figure 4:
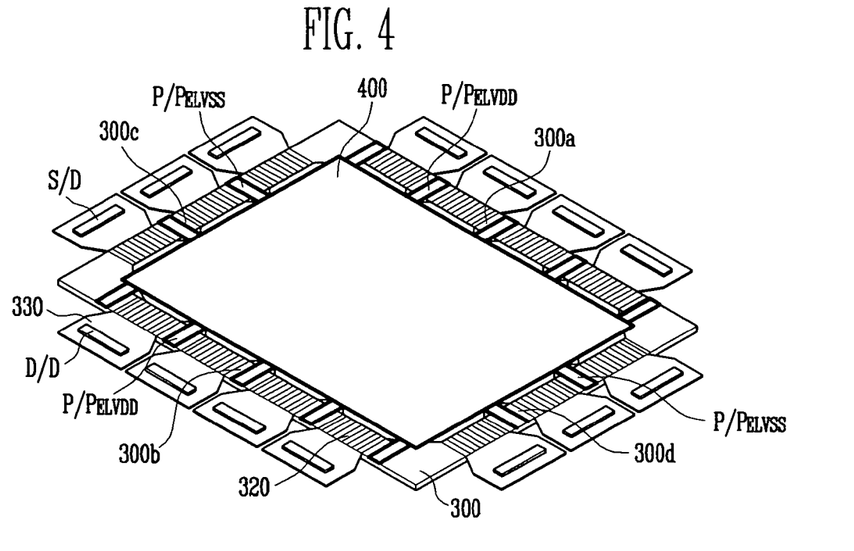
FIG. 4 is a coupled perspective view of the assembled organic light emitting display device of FIG. 3 and the FPCB for supplying power sources to pixels.

FIG. 3 is an exploded perspective view of an organic light emitting display panel and a flexible panel circuit board (FPCB) for supplying power sources to pixels constructed as an embodiment of the present invention. FIG. 4 is a coupled perspective view of the organic light emitting display of FIG. 3 and the FPCB for supplying power sources to pixels.

In FIGS. 3 and 4, the scan driver and/or the data driver are not mounted on the organic light emitting display panel but are mounted on an additional FPCB. The present invention is however not limited to these embodiments.

Referring to FIGS. 3 and 4, an organic light emitting display panel 300 includes a pixel unit 310 positioned in the center, a plurality of power source pads $P_{ELVDD}$ and $P_{ELVSS}$ and signal pads 320 positioned at side edges 300a to 300d to supply the pixel power sources ELVDD and ELVSS and driving signals to pixel unit 310.

Pixel unit 310 includes a plurality of pixels that are not shown. Pixel unit 310 displays an image to correspond to the driving signals supplied from signal pads 320 and the pixel power sources ELVDD and ELVSS supplied from the power source pads $P_{ELVDD}$ and $P_{ELVSS}$. Pixel unit 310 emits light to the opposite side 312 (hereinafter, a first side of organic light emitting display panel 300) that faces a pixel power source supplying FPCB 400 to display an image.

The power source pads $P_{ELVDD}$ and $P_{ELVSS}$ are provided at two or more edges of one side 311 (hereinafter, a second side of organic light emitting display panel 300) that faces the first side on which the image is displayed.

Specifically, the power source pads $P_{ELVDD}$ and $P_{ELVSS}$ include the first power source pads $P_{ELVDD}$ that receive the first pixel power source ELVDD and the second power source pads $P_{ELVSS}$ that receive the second pixel power source ELVSS.

The first and second power source pads $P_{ELVDD}$ and $P_{ELVSS}$ are dispersed at two or more edges of second surface 311 of organic light emitting display panel 300 to receive the first and second pixel power sources ELVDD and ELVSS in opposite two directions of the pixel power source supplying FPCB 400.

For example, the first power source pads $P_{ELVDD}$ may be formed at first and second edges 300a and 300b that face second side 311 of organic light emitting display panel 300. Therefore, the first power source pads $P_{ELVDD}$ can receive the first pixel power source ELVDD in two opposite directions to transmit the first pixel power source ELVDD to pixel unit 310.

The second power source pads $P_{ELVSS}$ may be formed at third and fourth edges 300c and 300d that face second side 311 of organic light emitting display panel 300. Therefore, the second power source pads $P_{ELVSS}$ can receive the second pixel power source ELVSS in two opposite directions to transmit the second pixel power source ELVSS to pixel unit 310.

That is, the first power source pads $P_{ELVDD}$ and the second power source pads $P_{ELVSS}$ can be formed at different edges of second side 311 of organic light emitting display panel 300.

The arrangement of the power source pads $P_{ELVDD}$ and $P_{ELVSS}$ according to the principles of the present invention is not limited to the above described features. That is, the first and second power source pads $P_{ELVDD}$ and $P_{ELVSS}$ are provided at three or more regions of second side 311 of organic light emitting display panel 300. Therefore, the first and second power source pads $P_{ELVDD}$ and $P_{ELVSS}$ may receive the first and second pixel power sources ELVDD and ELVSS in the at least three different directions. In this case, at least parts of the first and second power source pads $P_{ELVDD}$ and $P_{ELVSS}$ can be formed at the same edge of second side 311 of organic light emitting display panel 300.

Signal pads 320 are electrically coupled to driving FPCBs 330 included in addition to pixel power source supplying FPCB 400 to transmit the driving signals supplied from driving FPCBs 330 to pixel unit 310. Signal pads 320 can be provided between the first and second power source pads $P_{ELVDD}$ and $P_{ELVSS}$.

The plurality of driving FPCBs 330 electrically coupled to signal pads 320 can be provided.

The scan driver S/D for supplying the scan signals to pixel unit 310 and/or the data driver D/D for supplying the data signals to pixel unit 310 can be mounted on driving FPCBs 330.

On the other hand, pixel power source supplying FPCB 400 is provided on second side 311 of organic light emitting display panel 300. Pixel power source supplying FPCB 400 includes a plurality of pads P electrically coupled to the first and second power source pads $P_{ELVDD}$ and $P_{ELVSS}$ of organic light emitting display 300.

For example, as shown in FIG. 4, pixel power source supplying FPCB 400 maybe formed in the form of a plate to overlap pixel unit 310 to be provided on second side 311 of organic light emitting display panel 300. Pads P that overlap the first and second power source pads $P_{ELVDD}$ and $P_{ELVSS}$ of organic light emitting display panel 300 to be electrically coupled to the first and second power source pads $P_{ELVDD}$ and $P_{ELVSS}$ may be provided at the edges of pixel power source supplying FPCB 400.

Here, single-layer or multiple-layer lines (not shown) for supplying the first and second pixel power sources ELVDD and ELVSS are provided in the pixel power source supplying FPCB 400.

Pixel power source supplying FPCB 400 is electrically coupled to a power source supplying unit (not shown) mounted on a driving board through an interface to receive the first and second pixel power sources ELVDD and ELVSS. Pixel power source supplying FPCB 400 evenly applies the first and second pixel power sources ELVDD and ELVSS to the organic light emitting display panel 300 through an internal line.

According to the above present invention, the power source pads $P_{ELVDD}$ and $P_{ELVSS}$ of organic light emitting display panel 300 are provided at two or more edges so that the first and second pixel power sources ELVDD and ELVSS are supplied to organic light emitting display panel 300 in the at least two different directions.

Therefore, it is possible to minimize the IR drop of the first and second pixel power sources ELVDD and ELVSS in organic light emitting display panel 300. Therefore, although the size of organic light emitting display panel 300 may increase, it is possible for the organic light emitting display device to display an image of uniform picture quality. Therefore, the organic light emitting display device may be applied to various displays such as a TV and a sign board.

In addition, according to the present invention, pixel power source supplying FPCB 400 for supplying the first and second pixel power sources ELVDD and ELVSS to the organic light emitting display panel 300 is additionally provided. Pixel power source supplying FPCB 400 is formed in the shape of a plate that overlaps pixel unit 310 of organic light emitting display panel 300.

The first and second pixel power sources ELVDD and ELVSS may be evenly applied to the organic light emitting display panel 300 through the internal line of the pixel power source supplying FPCB 400.

Figure 5:
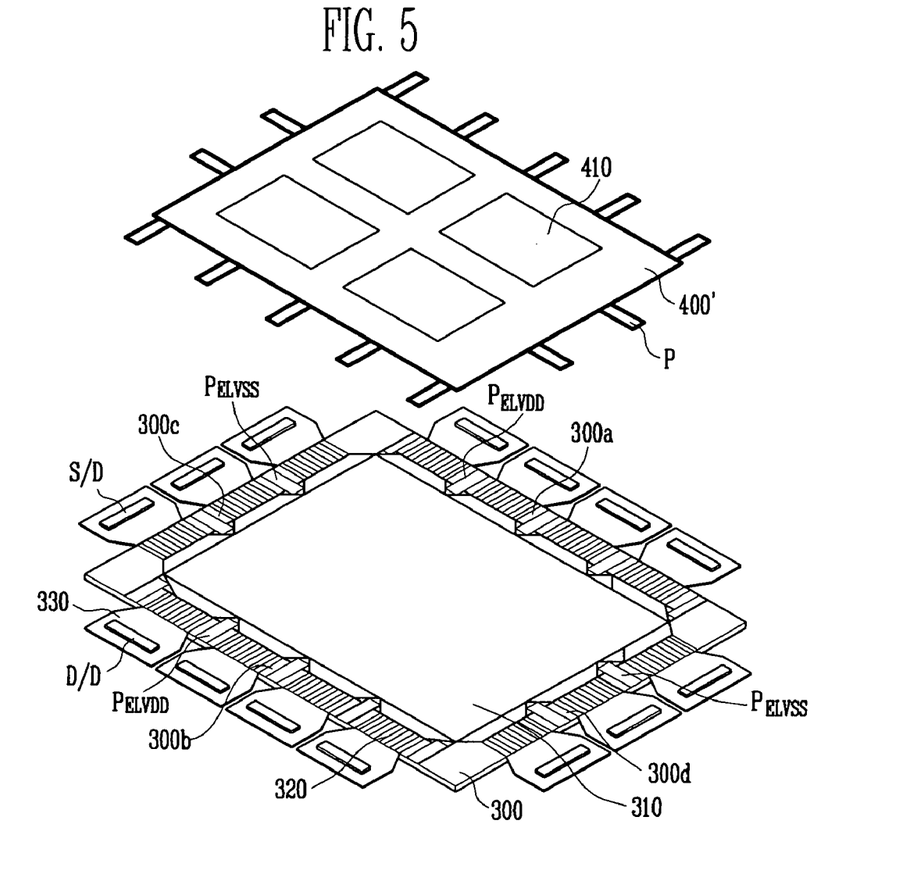
FIG. 5 is an exploded perspective view of an organic light emitting display panel device constructed as another embodiment of the present invention and the FPCB for supplying power sources to pixels.

FIG. 5 is an exploded perspective view of an organic light emitting display panel constructed as another embodiment of the present invention and the FPCB for supplying power sources to pixels. When FIG. 5 is described, the same part as the part of FIG. 3 is denoted by the same reference numeral and detailed description thereof will be omitted.

Referring now to FIG. 5, at least one aperture 410 is formed in at least one region of a pixel power source supplying FPCB 400'.

For example, a plurality of apertures 410 may be formed in the center of the plate-shaped pixel power source supplying FPCB 400'.

Aperture 410 may disperse the heat generated by applying the first and second pixel power sources ELVDD and ELVSS having a high voltage when organic light emitting display panel 300 is driven.

That is, the heat generated when organic light emitting display panel 300 may be driven easily contacts external air through apertures 410 of pixel power source supplying FPCB 400' to be dispersed.

Therefore, when organic light emitting display panel 300 is driven, it is possible to prevent heat from increasing due to increased temperature and to prevent driving defect.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display device, comprising:
an organic light emitting display panel comprising a first surface on which an image is displayed, a second surface that faces the first surface, and a plurality of first and second power source pads being respectively provided at least two edges of the second surface and receiving first and second pixel power sources in at least two directions; and
a continuous pixel power source supplying flexible printed circuit board (FPCB) being provided on the second surface of the organic light emitting display panel, comprising a plurality of pads electrically coupled exclusively to the first and second power source pads, and supplying the first and second pixel power sources to the organic light emitting display panel, with the pixel power source supplying FPCB completely covering a pixel unit which comprises a plurality of pixels.

2. The organic light emitting display device of claim 1, in which the plurality of first power source pads are formed at a first edge region of the second surface of the organic light emitting display panel and a second edge region that faces the first edge region, and the plurality of second power source pads are formed at a third edge region of the second surface and a fourth edge region that faces the third edge region.

3. The organic light emitting display device of claim 1, in which the plurality of first power source pads are formed at a first edge region of the second surface of the organic light emitting display panel and a second edge region that faces the first edge region.

4. The organic light emitting display device of claim 1, in which the plurality of second power source pads are formed at a third edge region of the second surface and a fourth edge region that faces the third edge region.

5. The organic light emitting display device of claim 1, in which the plurality of first power source pads and the plurality of second power source pads are formed at different edges of the second surface of the organic light emitting display panel.

6. The organic light emitting display device of claim 1, in which the plurality of first and second power source pads respectively receive the first and second pixel power sources of the pixel power source supplying flexible printed circuit board (FPCB) in two different directions that are opposite to each other and that face each other.

7. The organic light emitting display device of claim 1,
in which a pixel unit that receives the first and second pixel power sources from the plurality of first and second power source pads is positioned in the center of the organic light emitting display panel, and a plurality of signal pads for supplying driving signals to the pixel unit are formed between the plurality of first and second power source pads.

8. The organic light emitting display device of claim 7, in which the plurality of signal pads are electrically coupled to driving flexible printed circuit boards (FPCBs) provided in addition to the pixel power source supplying flexible printed circuit board (FPCB) to transmit the driving signals supplied from the driving flexible printed circuit boards (FPCBs) to the pixel unit.

9. The organic light emitting display device of claim 8, in which the driving flexible printed circuit boards (FPCBs) are plural.

10. The organic light emitting display device of claim 8, in which at least one of a scan driver and a data driver is mounted on the driving flexible printed circuit boards (FPCBs) to supply at least one of the scan signals and the data signals to the pixel unit.

11. The organic light emitting display device of claim 7,
in which the pixel power source supplying flexible printed circuit board (FPCB) is provided to overlap the pixel unit, and
the pads of the pixel power source supplying flexible printed circuit board (FPCB) are formed to overlap the first and second power source pads disposed on the second surface of organic light emitting display panel.

12. The organic light emitting display device of claim 1, in which at least one aperture is formed in at least one region of the pixel power source supplying flexible printed circuit board (FPCB).

13. A method of forming an organic light emitting display device, the method comprising:
providing an organic light emitting display panel comprising a first surface on which an image is displayed, and a second surface that faces the first surface with a plurality of first and second power source pads being respectively disposed at at least two either transverse or spaced apart edges of the second surface and receiving first and second pixel power sources in at least two different directions with a pixel unit being disposed at the center of the organic light emitting display panel;

providing a continuous pixel power source supplying flexible printed circuit board (FPCB) being provided on the second surface of the organic light emitting display panel, comprising a plurality of pads electrically coupled exclusively to the first and second power source pads, and supplying the first and second pixel power sources to the organic light emitting display panel;

completely covering the pixel unit which comprises a plurality of pixels by the pixel power source supplying FPCB; and overlapping respectively the pads of the pixel power source supplying FPCB with the first and second power source pads disposed on the second surface of organic light emitting display panel.

14. The method of claim 13, further comprising:
providing a plurality of signal pads for supplying driving signals to the pixel unit between the plurality of first and second power source pads.

15. The method of claim 14, further comprising:
electrically coupling the signal pads to driving flexible printed circuit boards (FPCBs) in order to transmit the driving signals supplied from the driving FPCBs to the pixel unit.

16. The method of claim 13, further comprising:
providing at least one aperture in at least one region of the pixel power source supplying flexible printed circuit board (FPCB).

* * * * *